United States Patent [19]
Fujitaka

[11] Patent Number: 5,909,403
[45] Date of Patent: Jun. 1, 1999

[54] MEMORY DRIVING APPARATUS

[75] Inventor: Shigeaki Fujitaka, Tokyo, Japan

[73] Assignee: Mitsubishi Denki Kabushiki Kaisha, Tokyo, Japan

[21] Appl. No.: 09/092,950

[22] Filed: Jun. 8, 1998

[30] Foreign Application Priority Data

Jan. 20, 1998 [JP] Japan .................................. 10-009141

[51] Int. Cl.[6] ................................................. G11C 7/00
[52] U.S. Cl. ............................... 365/189.09; 365/189.01; 365/204
[58] Field of Search ......................... 365/189.09, 189.01, 365/204, 210, 189.02

[56] References Cited

U.S. PATENT DOCUMENTS

5,455,795  10/1995  Nakao et al. .
5,638,316   6/1997  Hosokawa et al. ................ 365/189.09

*Primary Examiner*—Vu A. Le
*Attorney, Agent, or Firm*—Burns, Doane, Swecker & Mathis, L.L.P.

[57] ABSTRACT

A memory driving apparatus comprises instruction means and which instruction means instructs whether a reference voltage generating portion should be activated at all times or it should be activated only when data is read out.

4 Claims, 5 Drawing Sheets

MEMORY DRIVING APPARATUS

BACKGROUND OF THE INVENTION

1. Field of the Invention

The present invention relates to a memory driving apparatus for driving a memory such as a ROM.

2. Description of the Prior Art

Figure 2:
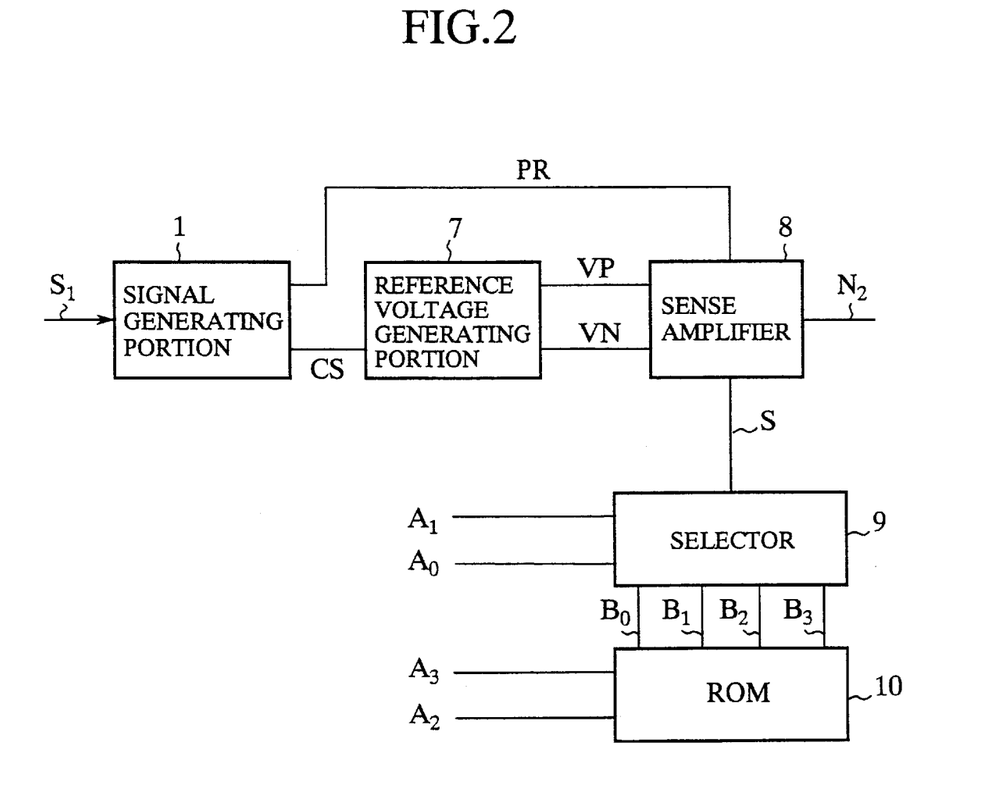
FIG. 2 is a block diagram showing a configuration of an example of a prior art memory driving apparatus.

FIG. 2 is a block diagram showing an example of structure of a prior art memory driving apparatus. Referring to FIG. 2, S1 denotes a signal for bus controlling output from the central portion constituted of a central processing unit (CPU) and the like, not shown, of the memory driving apparatus; 1 denotes a signal generating portion for generating a chip select signal CS and a pre-charge signal PR for controlling operations of the memory driving apparatus; 7 denotes a reference voltage generating portion for generating reference voltages VP and VN for reading out a signal retained in a read only memory (ROM) 10; 8 denotes a sense amplifier for outputting a signal corresponding to the logical level written in each ROM cell of the ROM 10; 9 denotes a selector for selecting a bit line among bit lines B0–B3 of the ROM 10; 10 denotes the ROM as the object out of which the present memory driving apparatus reads data; CS denotes a chip select signal output from the signal generating portion 1; PR denotes a pre-charge signal output from the signal generating portion 1; VP and VN denote reference voltages output from the reference voltage generating portion 7; N2 denotes a node as the output terminal of the sense amplifier 8; S denotes a node as the junction point between the sense amplifier 8 and the selector 9; A0 and A1 denote address signals for selecting a bit line among the bit lines B0–B3; A2 and A3 denote address signals for selecting a word line among word lines of the ROM 10; B0–B3 denote the bit lines of the ROM 10.

Figure 3:
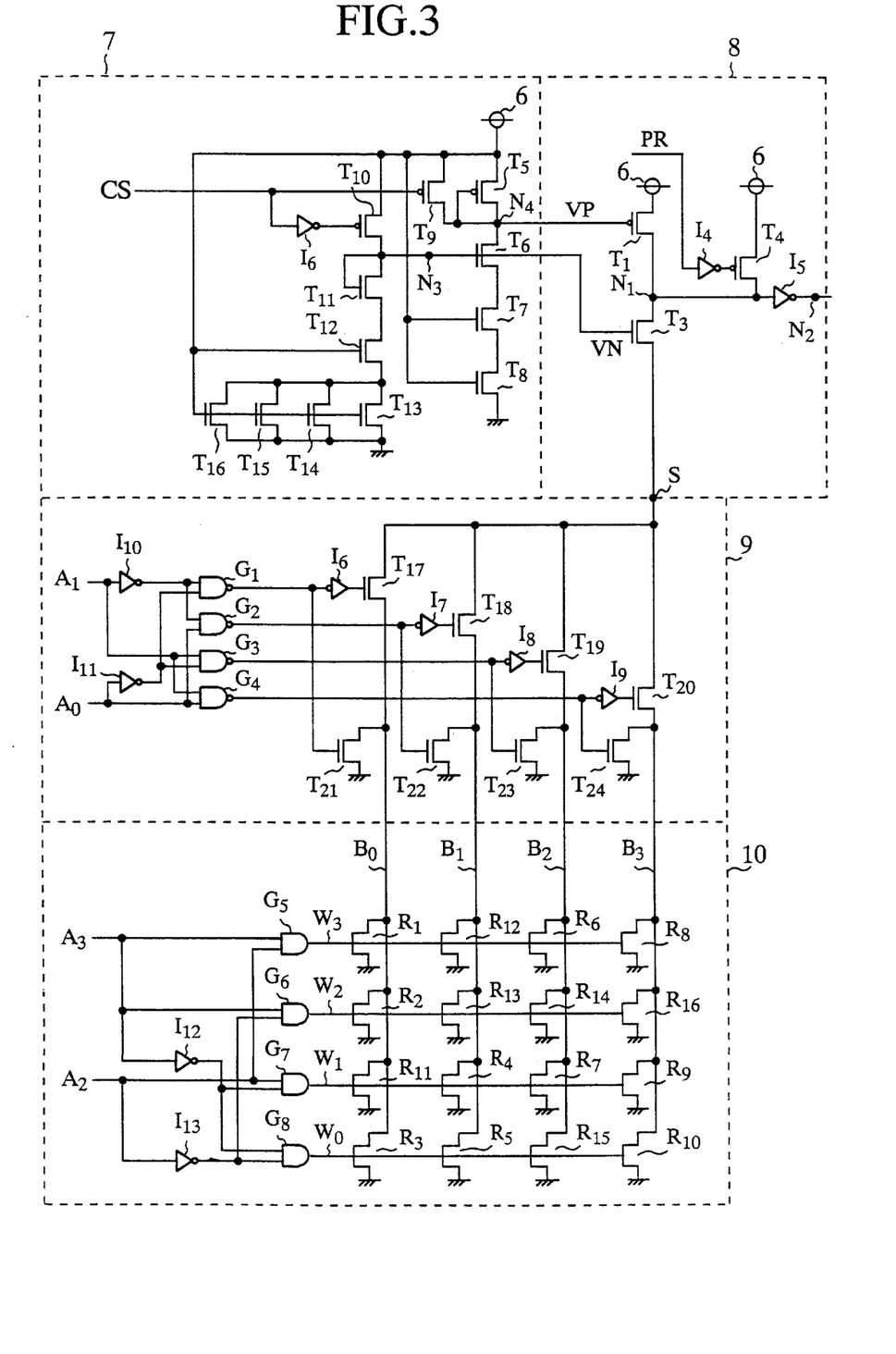
FIG. 3 is a circuit diagram showing concrete configurations of the reference voltage generating portion, the sense amplifier, the selector, and the ROM in the memory driving apparatus shown in FIG. 2.

FIG. 3 is a circuit diagram showing concrete configurations of the reference voltage generating portion 7, the sense amplifier 8, the selector 9, and the ROM 10 of the memory driving apparatus shown in FIG. 2.

First, the concrete configuration of the reference voltage generating portion 7 will be described. Reference numeral 6 denotes a source voltage input terminal to which a source voltage of 5V is applied; T5 and T9 denote a P-channel transistor, respectively, for generating the reference voltage VP; T6, T7, and T8 denote an N-channel transistor, respectively, for similarly generating the reference voltage VP; N4 denotes a node as the point where the drain and the gate of the transistor T5, the drain of the transistor T9, and the drain of the transistor T6 join; T10 denotes a P-channel transistor for generating the reference voltage VN; I6 denotes an inverter for inverting the chip select signal CS and supplying it to the gate of the transistor T10; T11–T16 denote an N-channel transistor, respectively, for generating the reference voltage VN. The transistor T11 has the same channel length and four times as large channel width as the transistor T6 has, while the transistor T12 has the same channel length and four times as large channel width as the transistor T7 has. Reference character N3 denotes a node as the point where the drain of the transistor T10, the drain and the gate of the transistor T11, and the gate of the transistor T6 join. The transistors T10–T16 function as the voltage source for supplying the gate voltage of the transistor T6.

Now, the concrete configuration of the sense amplifier 8 will be described.

Reference character T1 denotes a P-channel transistor, which functions as the current source for supplying current to the node N1; T3 denotes an N-channel transistor, which acts as a grounded-gate amplifier and has the same channel length and the same channel width as the transistor T6 has. Reference character T4 denotes a P-channel transistor for supplying current to the bit lines B0–B3; I4 denotes an inverter for inverting the pre-charge signal PR and supplying it to the gate of the transistor T4; I5 denotes an inverter functioning as a buffer amplifier at the output stage; N1 denotes a node as the point where the drain of the transistor T1, the drain of the transistor T3, the drain of the transistor T4, and the input terminal of the inverter I5 join.

Next, the concrete configuration of the selector 9 will be described.

Reference character I10 denotes an inverter for inverting the address signal A1; I11 denotes an inverter for inverting the address signal A0; G1–G4 denote a NAND gate, respectively, which functions as an address decoder in the aggregate; I6, I7, I8, and I9 denote an inverter, respectively, for inverting the output signals of the NAND gates G1, G2, G3, and G4, respectively, and supplying the inverted signals to the gates of the transistors T17, T18, T19, and T20, respectively; T17, T18, T19, and T20 denote an N-channel transistor, respectively, for breaking and making the connections of the bit lines B0, B1, B2, and B3 with the node S; respectively; T21, T22, T23, and T24 denote an N-channel transistor, respectively, for grounding the bit lines B0, B1, B2, and B3, respectively. The transistors T17–T20 have an equal channel length and a channel width, respectively, to each other, and the channel length and the channel width are same as those of the transistor T7 of the reference voltage generating portion 7. The transistors T21–T24 also have an equal channel length and a channel width, respectively, to each other.

Now, the concrete configuration of the ROM 10 will be described.

Reference character I12 denotes an inverter for inverting the address signal A3; I13 denotes an inverter for inverting the address signal A2; G5–G8 denote an AND gate, respectively, which functions as an address decoder in the aggregate; W3, W2, W1, and W0 denote a word line, respectively, which is connected to the output terminals of the AND gates G5, G6, G7, and G8, respectively; R1 denotes a ROM cell whose address is designated by the word line W3 and the bit line B0; R2 denotes a ROM cell whose address is designated by the word line W2 and the bit line B0; R3 denotes a ROM cell whose address is designated by the word line W0 and the bit line B0; R4 denotes a ROM cell whose address is designated by the word line W1 and the bit line B1; R5 denotes a ROM cell whose address is designated by the word line W0 and the bit line B1; R6 denotes a ROM cell whose address is designated by the word line W3 and the bit line B2; R7 denotes a ROM cell whose address is designated by the word line W1 and the bit line B2; R8 denotes a ROM cell whose address is designated by the word line W3 and the bit line B3; R9 denotes a ROM cell whose address is designated by the word line W1 and the bit line B3; R10 denotes a ROM cell whose address is designated by the word line W0 and the bit line B3; R11 denotes a ROM cell whose address is designated by the word line W1 and the bit line B0; R12 denotes a ROM cell whose address is designated by the word line W3 and the bit line B1; R13 denotes a ROM cell whose address is designated by the word line W2 and the bit line B1; R14 denotes a ROM cell whose address is designated by the word line W2 and the bit line B2; R15 denotes a ROM cell whose address is designated by the word line W0 and the bit line B2; R16 denotes a ROM cell whose address is designated by the word line W2 and the bit line B3. The ROM cells R1–R16 are an N-channel transistor, respectively, all of which have a same channel length and a channel width, respectively. The channel length and the channel width of them are the same as those of the transistor T8 and the transistors T13–T16 of the reference generating portion 7. The ROM cells R11–R16 have been channel-cut, and the threshold voltage of them is set to be 5V or higher. Namely, writing in the ROM cells R11–R16 has been made so that, even if a voltage of 0–5V is applied to the gate of them, no drain current flows in them. The ROM 10 as a whole has a NOR type memory block configuration.

Figure 4:
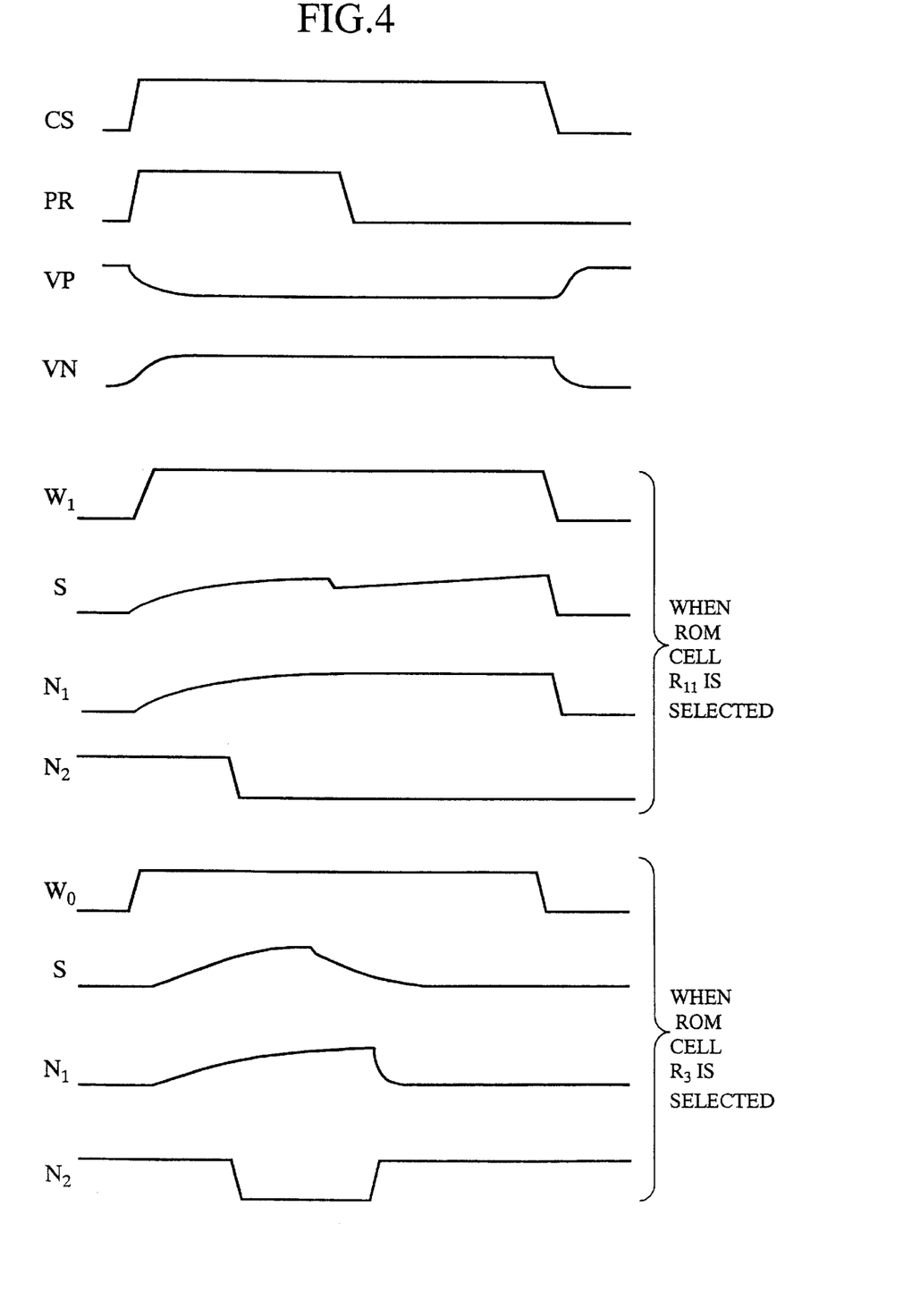
FIG. 4 is a timing chart showing operations of the memory driving apparatus shown in FIG. 2.

Now, operations will be described also referring to the timing chart of FIG. 4.

In the reference voltage generating portion 7, when the source voltage is applied to the source voltage input terminal 6, the transistors T7, T8, and T12–T16 are held ON at all times. In this state, while the chip select signal CS is at the L level, the transistor T9 is ON and the transistor T10 is OFF. Accordingly, the transistor T11 is in its OFF state and the potential of the node N3, i.e., the reference voltage VN, is at the L level. Hence, the transistor T6 is in its OFF state and the source voltage is supplied to the node N4 through the transistor T9 to bring the reference voltage VP to the H level.

When a signal S1 for bus controlling is input from the central portion of the memory driving apparatus to the signal generating portion 1, the signal generating portion 1 raises the chip select signal CS and the pre-charge signal PR to the H level.

When the chip select signal CS rises to the H level, the transistor T9 is turned OFF and, hence, the transistor T5 is turned ON. On the other hand, the output level of the inverter I6 is brought to the L level and the transistor T10 is turned ON, and thereby, the transistor T11 is turned ON. Since the transistors T12–T16 are ON, current flows, via the transistor T10 and T11, into the transistors T10–T16 and, thus, the transistors T10–T16 act as the voltage source for supplying the gate voltage of the transistor T6. Since the transistor T6 is thereby turned ON and the transistors T7 and T8 are held ON, the reference voltage VP is pulled to a potential (L level) determined by the ratio between the resistance values of the transistor T5 and the transistors T6–T8. On the other hand, the reference voltage VN is raised to a potential (about 1.5V in the present example) determined by the ratio between the resistance values of the transistor T10 and the transistors T11–T16. Incidentally, the transistor T10 supplies a current of about 400 µA to the transistors T11–T16.

In the sense amplifier 8, while the pre-charge signal PR is at the L level, the reference voltage VP is at the H level, and the reference voltage VN is at the L level, the transistor T1 is in its OFF state, and the transistor T3 is also in its OFF state, and then the transistor T4 is in an OFF state. Hence, the potential of the node N1 is at the L level and, accordingly, the output voltage as the potential of the node N2 is at the H level.

Here, we consider the case where the address signals A3, A2, A1, and A0 are at the L, H, L, and L levels, respectively. At this time, in the selector 9, the output level of the NAND gate G1 is brought to the L level and, hence, the transistor T17 is turned ON and the transistor T21 is turned OFF. Thereby, the bit line B0 is connected to the node S. The potential of the other bit lines B1–B3 is fixed to 0V because the transistors T22–T24 are turned ON. At this time, in the ROM 10, the output level of the AND gate G7 goes to the H level, and the word line W1 goes to the H level. Thereby, linked together with the above-described selection of the bit line B0, the ROM cell R11 of the ROM 10 is selected.

Concerning the transistors of the reference voltage generating portion 7, as described above, the transistor T6 has the same channel length and the channel width as the transistor T3 of the sense amplifier 8 has, the transistor T11 has the same channel length and four times as large channel width as the transistor T6 has. The transistor T7 has the same channel length and the channel width as each of the transistors T17–T20 of the selector 9 has, and the transistor T12 has the same channel length and four times as large channel width as the transistor T7 has. Further, the transistor T8 and T13–T16 each have the same channel length and the channel width as the ROM cells R1–R16 of the ROM 10 each have. Hence, the bit line corresponding to the address of the specified ROM cell is pre-charged when the chip select signal CS is at the H level, so that about one fourth of the current of 400 µA flowing through the transistor T10 of the reference voltage generating portion 7, i.e., a current of about 100 µA, may flow, via the transistors T1 and T3 of the sense amplifier 8, into the pertinent ROM cell, when the gate voltage of the ROM cell is the source voltage of 5V, by the current mirror effect.

When the pre-charge signal PR goes to the H level, the transistor T4 of the sense amplifier 8 is turned ON and the node N1 is charged to approach the source voltage of 5V. At the same time, the node S and the bit line B0 are charged through the transistor T3. The transistor T3 causes the potential of the node N1 to change according as the amount of the current drawn from the node S. Incidentally, since, in this prior art example, the reference voltage VN is about 1.5V, the bit line B0 is charged only up to 0.7V or so. Although the ROM cell R11 is selected by the connection of the bit line B0 with the node S by the selector 9 and the rise of the word line W1 to the H level, the current supplied to the bit line B0, as it is, keeps on being charged to the bit line B0 because the ROM cell R11 has been written in so as not to draw current from the bit line B0 even if the word line W1 is at the H level.

As the result of the node N1 getting charged, the node N2 as the output terminal of the inverter I5 is reversed to the L level. And, when the potential of the bit line B0 has become a substantially fixed value, the pre-charge signal PR falls to the L level. The pre-charge period is up to this point of time.

The pre-charge period is over when a predetermined period of time has elapsed after the chip select signal CS and the pre-charge signal PR were both raised to H levels. Then, the pre-charge signal PR falls to the L level, the transistor T4 is turned OFF, and the current which has been supplied from the power source through the transistor T4 is stopped. Thereby, the potential of the node N1, node S, and the bit line B0 slightly falls but the fall in the potential is of such a degree that gives no effect to the output level of the inverter I5. Thereafter, the potential of the node N1, node S, and the bit line B0 is gradually raised by the current supplied from the power source through the transistor T1 and, hence, the potential of the node N2 is maintained at the L level. This means that the L level, i.e., a logical value 0, is read out of the ROM cell R11.

Now, the case where the address signals A3, A2, A1, and A0 are all L will be considered. At this time, in the selector 9, only the output signal of the NAND gate G1 goes to the L level and the output signals of the other NAND gates G2–G4 go to the H level. Thereby, the bit line B0 is connected to the node S, while the other bit lines B1–B3 are not connected to the node S and held at the potential of 0V. Further, in the ROM 10, only the output level of the AND gate G8 goes to the H level, and the output levels of the other AND gates G5–G7 go to the L level. Accordingly, the word line W0 goes to the H level and thus the ROM cell R3 is selected.

In this case, as with the above described case, the node N1, when the chip select signal CS and the pre-charge signal PR are raised to the H level, is supplied with current from the power source through the transistor T4 to obtain a potential approaching the source voltage of 5V. Since the ROM cell R3 is selected in the ROM 10 in this case, the ROM cell R3 draws current from the bit line B0. However, since the current supplied to the node N1 through the transistor T4 is much greater than the current drawn from the bit line B0 by the ROM cell R3, the potential of the node N1 keeps on rising. On the other hand, while the bit line B0 is charged through the transistor T3 and the node S, since the current is drawn by the ROM cell R3, the potential is kept below that in the above described case where the ROM cell R11 was selected, i.e., at around 0.4V.

When the pre-charge signal PR falls to the L level, the transistor T4 is turned OFF. Since the current flowing through the transistor T1 is about ¼ of the current drawn by the ROM cell R3, the potential of the node N1 in this state gradually falls. Although the potential of the node S and the bit line B0 also falls, the fall in the potential of them is small because the bit line capacitance is great compared to the capacitance of the node N1. When the potential of the node N1 falls below a certain value, the output potential of the inverter I5 is reversed to the H level. This means that the H level, i.e., the logical value 1, is read out of the ROM cell R3.

Figure 5:
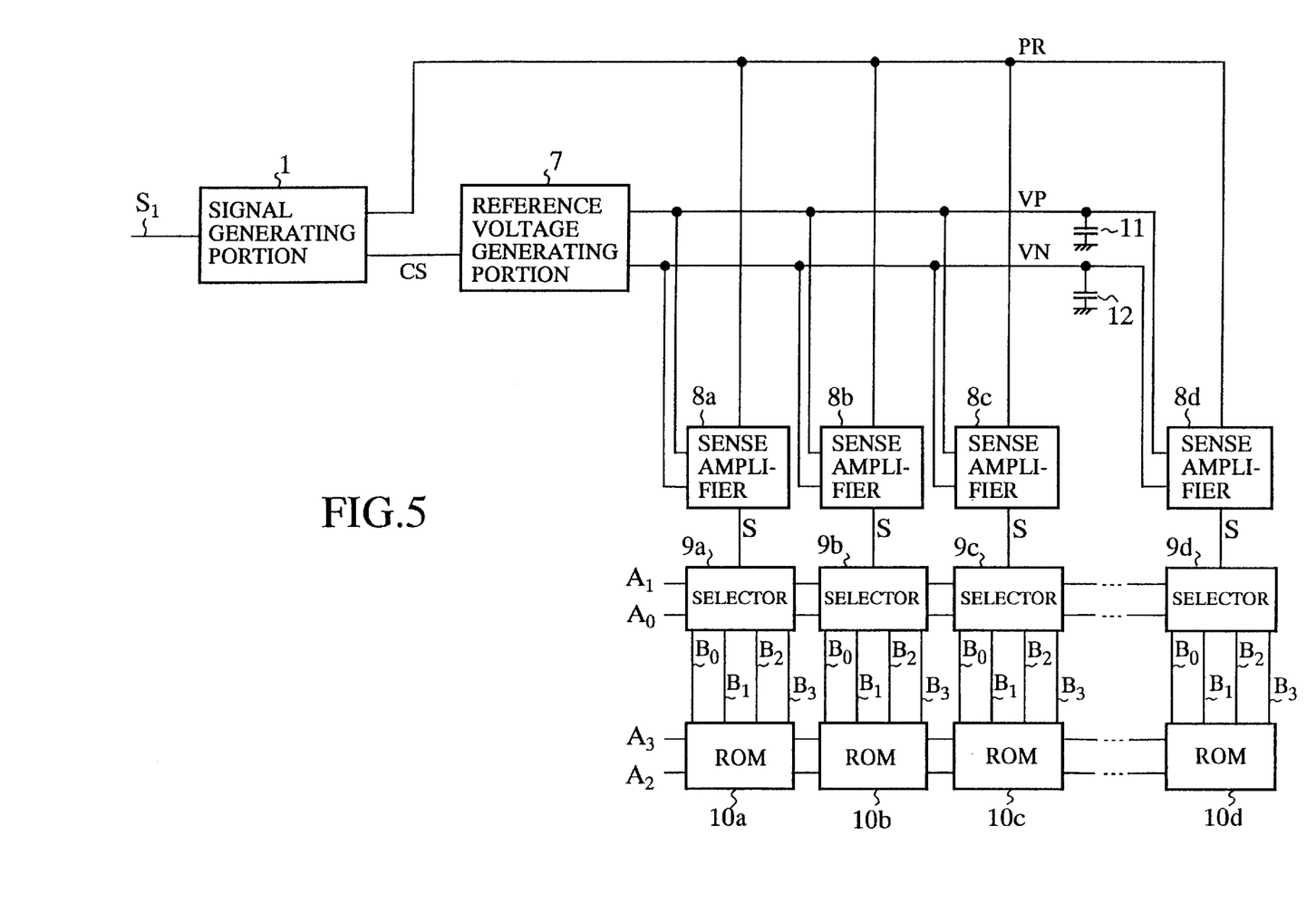
FIG. 5 is a block diagram showing an actual configuration of a prior art memory driving apparatus.

While the case where the sense amplifier 8 reads out a one-bit signal was described in the foregoing, several to several tens of sense amplifiers 8 are required in an actual real memory driving apparatus. Namely, the operation shown in FIG. 4 must be performed as many times as the number of the sense amplifiers 8. An actual circuit has a configuration for example as shown in FIG. 5. That is, referring to FIG. 5, reference numerals 8a, 8b, 8c, and 8d each denote a sense amplifier outputting a read-out signal of one bit; 10a, 10b, 10c, and 10d denote a ROM, respectively, as the objects out of which the sense amplifiers 8a, 8b, 8c, and 8d read out data written therein, respectively; 9a, 9b, 9c, and 9d denote a selector, respectively, selecting a bit line among the bit lines B0–B3 of the ROMs 10a, 10b, 10c, and 10d, respectively; 11 denotes the wiring capacitance of the signal line supplying a reference voltage VP; 12 denotes the wiring capacitance of the signal line supplying a reference voltage VN. Other constituents are the same as those in the prior art example shown in FIG. 2. Further, operations of each of the pluralities of sense amplifiers 8a, 8b, 8c, and 8d, selectors 9a, 9b, 9c, and 9d, and the ROMs 10a, 10b, 10c, and 10d are the same as in the above described case where one each of the sense amplifier 8, the selector 9, and the ROM 10 are provided.

According to the actual memory driving apparatus of the prior art shown in FIG. 5, there are multiple sense amplifiers 8a, 8b, 8c, and 8d, selectors 9a, 9b, 9c, and 9d, and ROMs 10a, 10b, 10c, and 10d arranged in parallel and connected to one set of the signal generating portion 1 and the reference voltage generating portion 7. Namely, one signal generating portion 1 and one reference voltage generating portion 7 are provided to each of the sense amplifiers 8a, 8b, 8c and 8d. Therefore, one reference voltage generating portion 7 must drive the transistors T1 and T3 same in number as the sense amplifiers 8a, 8b, 8c, and 8d, which transistors T1 and T3 are provided with each sense amplifier 8a, 8b, 8c and 8d by one, respectively.

According as the chip select signal CS and the pre-charge signal PR become faster, the parasitic capacitance constituted of the wiring capacitance 11 and 12 due to wiring arrangement of the signal lines for supplying the reference voltages VP and VN and the gate capacitance of the transistors T1 and T3 becomes non-negligible. Although the reference voltage VP fell and the reference voltage VN rose during the pre-charge period in the operation of the prior art example shown in FIG. 4, it sometimes becomes impossible, according as the signals become faster, for the reference voltage VP to fall and for the reference voltage VN to rise during the pre-charge period. This means that reading out of the memory becomes impossible in the fast operation.

As a measure to deal adequately with the faster pre-charge signal PR, there is a method to hold the chip select signal CS, for example, at the H level at all times. According to this method, the reference voltages VP and VN can be constantly kept at predetermined values and, hence, making the faster operation becomes possible. However, since the reference voltage generating portion 7 is activated at all times, it keeps on outputting the reference voltages VP and VN which constantly take on fixed DC values and, therefore, the consumption current becomes increased when the apparatus is operated slowly, for example, with the pre-charge signal PR at a frequency of 32 kHz or so or when the values in the RAM, not shown, are held retained while the memory driving apparatus is not making any operation, namely, in the stop mode in which read out of the ROM 10 is not performed.

As another measure to achieve a fast operation, there is a way in which the reference voltage generating portions 7 of the same number as the number of the sense amplifiers 8a, 8b, 8c, and 8d are provided, but, in this case, the area required for arranging the reference voltage generating portions 7 therein becomes greater. Further, there is a way in which the output impedance of the reference voltage generating portion 7 is lowered, but even if this method is used, there still is a defect of an increase in the current consumption by the reference voltage generating portion 7.

Since prior art memory driving apparatuses are configured as described above, there have been such problems that the rise of the reference voltages is retarded by the parasitic capacitance constituted of the wiring capacitance, gate capacitance, and the like, and thereby fast read out of the memory is made impossible, that the current consumption increases when such a method for achieving the fast reading is used as to keep the chip select signal at the H level at all times or to lower the output impedance of the reference voltage generating portion, and that, in such a method as to provide the reference voltage generating portions of the same number as that of the sense amplifiers, the area for arranging the reference voltage generating portions therein is increased.

SUMMARY OF THE INVENTION

In view of the above mentioned problems, it is an object of the invention to provide a memory driving apparatus capable of high-speed operation with the reference voltages hardly affected by the parasitic capacitance, the current consumption kept small, and the area for arranging the reference voltage generating portion therein not increased.

In order to achieve the above described object, there is provided, according to a first aspect of the invention, a memory driving apparatus comprising instruction means for outputting a signal instructing whether the reference voltage generating portion should be activated at all times or the same should be activated only when the data is read out. Thereby, such effects are obtained that the memory driving apparatus can be operated fast without being affected by the wiring capacity of the signal lines for supplying reference voltages and, further, the apparatus can be operated fast without increasing the area in which the reference voltage generating portion is arranged and without increasing power consumption.

According to a second aspect of the invention, there is provided a memory driving apparatus in which instruction means further outputs, in a stop mode, an instruction signal for inhibiting the reference voltage generating portion from being activated. Thereby, such an effect is obtained that memory driving means can be prevented from consuming current in the stop mode.

According to a third aspect of the invention, there is provided a memory driving apparatus comprising a selecting circuit for selecting either the chip select signal or the source voltage and outputting the selected signal. Thereby, such effects are obtained that the memory driving apparatus can be operated fast without being affected by the wiring capacity of the signal lines for supplying reference voltages and, further, the apparatus can be operated fast without increasing the area in which the reference voltage generating portion is arranged and without increasing power consumption.

According to a fourth aspect of the invention, there is provided a memory driving apparatus further comprising gate means for bringing the input level of the reference voltage generating portion to the logically L level when a stop signal for controlling the memory driving apparatus to be brought to its stop state is at the logically H level. Thereby, such an effect is obtained that the reference voltage generating portion of the memory driving means can be prevented from consuming current in the stop mode.

BRIEF DESCRIPTION OF THE DRAWINGS

Further objects and advantages of the invention will be more fully understood by reading the following detailed description with reference to the accompanying drawings.

DETAILED DESCRIPTION OF THE PREFERRED EMBODIMENT

A preferred embodiment of the invention will be described in detail with reference to the accompanying drawings.

Figure 1:
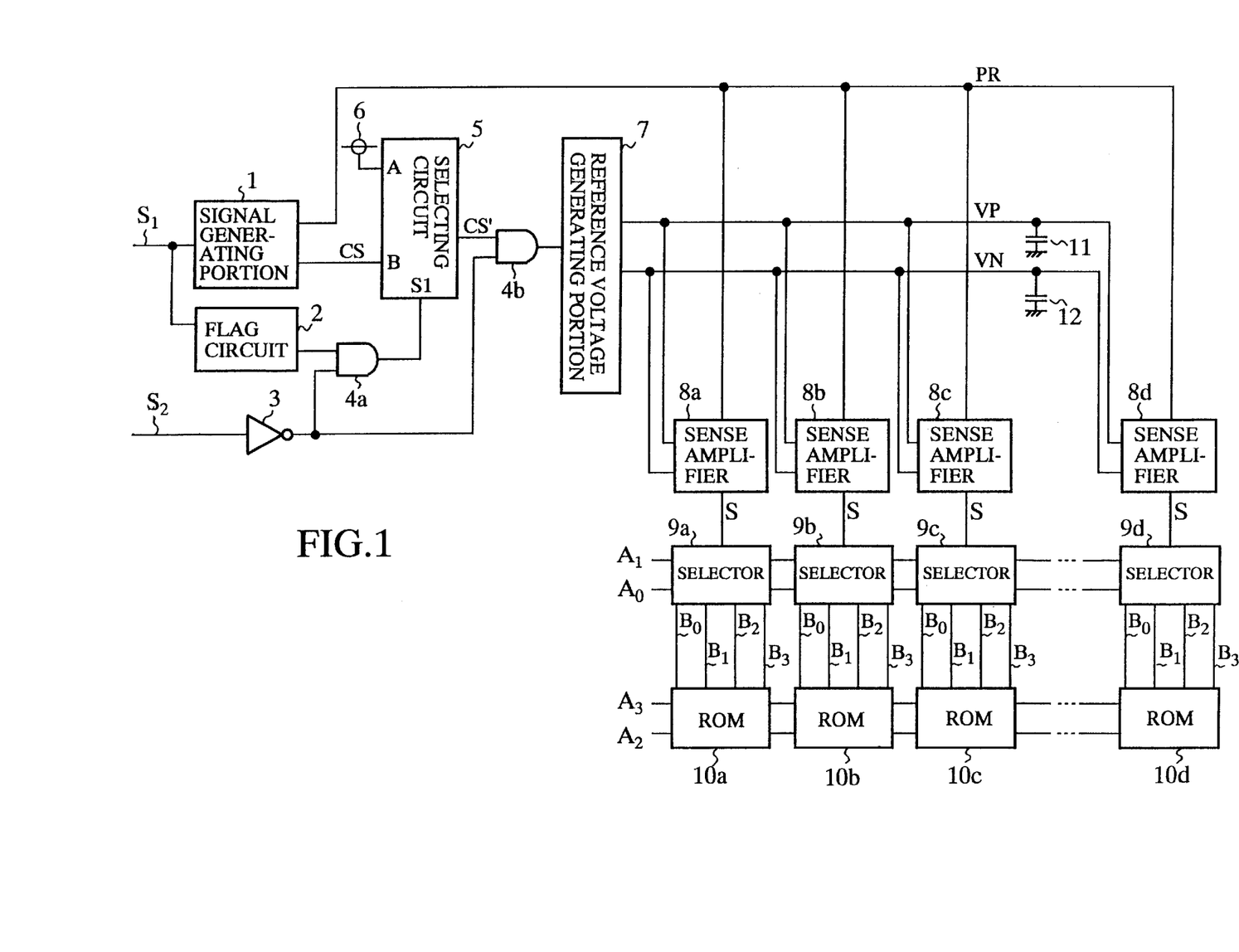
FIG. 1 is a block diagram showing a configuration of a memory driving apparatus according to an embodiment of the invention.

FIG. 1 is a block diagram showing a configuration of a memory driving apparatus according to an embodiment of the invention. Referring to the drawing, reference character S1 denotes a signal for bus controlling output from the central portion constituted of a CPU and the like, not shown, of the memory driving apparatus; S2 denotes a stop signal output from the central portion for controlling the memory driving apparatus to be brought to its stopped state. Reference numeral 1 denotes a signal generating portion for generating a chip select signal CS and a pre-charge-signal PR for controlling operations of the memory driving apparatus. Reference character CS denotes the chip select signal output from the signal generating portion 1; PR denotes the pre-charge signal output from the signal generating portion 1. Reference numeral 2 denotes a flag circuit (instruction means) for setting a flag in response to the signal S1 for bus controlling; 3 denotes an inverter (instruction means) for inverting the stop signal S2; 4a denotes an AND gate (instruction means, gate means) accepting as inputs the output signals of the flag circuit 2 and the inverter 3; 5 denotes a selecting circuit (instruction means) for selecting either of the signals input to both its terminals A and B in accordance with the level of the signal input to its input signal selecting terminal S1 and outputting the selected signal. The terminal A of the selecting circuit 5 is connected with a source voltage input terminal 6 to which a source voltage of 5V is applied, the terminal B accepts as input the chip select signal CS output from the signal generating portion 1, and the terminal S1 is connected with the output terminal of the AND gate 4a. Reference character CS' denotes an output signal output from the selecting circuit 5, which selecting circuit 5 outputs the chip select signal CS input to its terminal B as the output signal CS' when the level of the input signal to the terminal S1 is L and outputs the source voltage input to its terminal A as the output signal CS' when the level of the input signal to the terminal S1 is H. Reference numeral 4b denotes an AND gate (instruction means, gate means) accepting the output signal CS' of the selecting circuit 5 and the output signal of the inverter 3 as inputs to its two input terminals.

Reference numeral 7 denotes a reference voltage generating portion for generating reference voltages VP and VN for reading out signals retained in ROMs 10a, 10b, 10c, and 10d; VP and VN denote the reference voltages output from the reference voltage generating portion 7; 8a, 8b, 8c, and 8d denote sense amplifiers each outputting a read-out signal of one bit; 10a, 10b, 10c, and 10d denote the ROMs (address designation means, memory elements) as the objects out of which the sense amplifiers 8a, 8b, 8c, and 8d read data written therein, respectively; 9a, 9b, 9c, and 9d denote selectors (address designation means) for selecting among bit lines B0–B3 of their respective ROMs 10a, 10b, 10c, and 10d; 11 denotes wiring capacitance of the signal line supplying the reference voltage VP and 12 denotes wiring capacitance of the signal line supplying the reference voltage VN. Since concrete configurations and operations of the signal generating portion 1, reference voltage generating portion 7, sense amplifiers 8a, 8b, 8c, and 8d, selectors 9a, 9b, 9c, and 9d, and the ROMs 10a, 10b, 10c, and 10d are the same as the corresponding constituents of the prior art memory driving apparatus shown in FIG. 3 to FIG. 5, detailed description about the configurations and operations of each constituent will not be made here again.

Now, operations will be described.

First, operations of the memory driving apparatus when it is not in the stop mode will be described. When the memory driving apparatus reads data fast out of the ROMs 10a, 10b, 10c, and 10d, the flag circuit 2 outputs a signal at the H level in accordance with the bus controlling signal S1. Since the stop signal S2 is at the L level, the output signal of the AND gate 4a goes to the H level. Accordingly, the selecting circuit 5 outputs the source voltage fixed at the H level as the output signal CS'. The output signal of the AND gate 4b goes to the H level. Therefore, the reference voltage generating portion 7 constantly outputs the reference signals VP and VN. By the reference signals VP and VN constantly assuming fixed voltage values, the sense amplifiers 8a–8d are permitted to make data reading out of the ROMs 10a–10d fast, not affected by the wiring capacitance 11 and 12.

Then, when the memory driving apparatus slowly reads data out of the ROMs 10a–10d, the flag circuit 2 outputs a signal at the L level in accordance with the bus controlling signal S1. Hence, the output signal of the AND gate 4a goes to the L level. Accordingly, the selecting circuit 5 outputs the chip select signal CS output from the signal generating portion 1 as the output signal CS'. The output signal of the AND gate 4b also becomes this chip select signal CS. Hence, the reference voltage generating portion 7 is turned ON only when data are read out from the ROMs 10a–10d and, thereby, current is prevented from constantly flowing through the reference voltage generating portion 7. Thus, the current consumption by the reference voltage generating portion 7 is prevented from increasing. Further, since the pre-charge signal PR is slow, the rises of the reference voltages VP and VN are not affected by the wiring capacitance 11 and 12.

Then, when the memory driving apparatus is in the stop mode, the stop signal S2 is held at the H level and, hence, the output signals of the AND gates 4a and 4b go to the L level. Accordingly, the input signal to the reference voltage generating portion 7 goes to the L level so that current is prevented from constantly flowing through the reference voltage generating portion 7. Therefore, also in the stop mode, current consumption by the reference voltage generating portion 7 is prevented from increasing.

According to the embodiment, as described above, such meritorious effects can be obtained that the apparatus is permitted to make fast operation without being affected by the wiring capacitance of the signal lines for supplying the reference voltages and, further, it is permitted to make fast operation without increasing the area for arranging the reference voltage generating portion therein and without increasing the power consumption.

The description of the preferred embodiment of the invention given above is for illustrative purpose only, and it is to be understood that modifications and changes from what were described above may be made without departing from the spirit and the scope of the following claims.

What is claimed is:

1. In a memory driving apparatus comprising:

address designation means for designating an address of a memory element;

a reference voltage generating portion for generating a reference voltage for reading out a signal retained at an address of said memory element designated by said address designation means; and a sense amplifier for outputting a signal read out of said memory element;

the improvement comprising instruction means for outputting a signal instructing whether said reference voltage generating portion should be activated at all times or the same should be activated only when said data is read out.

2. A memory driving apparatus according to claim 1, wherein said instruction means further outputs, in a stop mode, an instruction signal inhibiting the reference voltage generating portion from being activated.

3. In a memory driving apparatus comprising:

a signal generating portion for generating a chip select signal and a pre-charge signal;

a reference voltage generating portion for generating a reference voltage for reading out a signal retained in a memory element;

a sense amplifier for outputting a signal read out of said memory element; and a selector for selecting among bit lines of said memory element;

the improvement comprising a selecting circuit for selecting either said chip select signal or the source voltage and outputting the selected signal.

4. A memory driving apparatus according to claim 3, further comprising gate means for bringing the input level of said reference voltage generating portion to a logically L level when a stop signal for controlling said memory driving apparatus to be brought to its stop state is at a logically H level.

* * * * *